US007609134B2

(12) United States Patent
Yamamoto

(10) Patent No.: US 7,609,134 B2
(45) Date of Patent: Oct. 27, 2009

(54) VARIABLE TUNING CIRCUIT USING VARIABLE CAPACITANCE DIODE AND TELEVISION TUNER

(75) Inventor: Masaki Yamamoto, Fukushima-ken (JP)

(73) Assignee: ALPS Electronic Co., Ltd., Tokyo (JP)

( * ) Notice: Subject to any disclaimer, the term of this patent is extended or adjusted under 35 U.S.C. 154(b) by 22 days.

(21) Appl. No.: 11/940,972

(22) Filed: Nov. 15, 2007

(65) Prior Publication Data
US 2008/0129428 A1    Jun. 5, 2008

(30) Foreign Application Priority Data
Dec. 5, 2006    (JP)    ............... 2006-328153

(51) Int. Cl.
*H03J 3/06*    (2006.01)
(52) U.S. Cl. ........................................ 334/15
(58) Field of Classification Search ............ 334/1, 334/14, 15, 64, 78
See application file for complete search history.

(56) References Cited

U.S. PATENT DOCUMENTS

| 2,196,881 A | 4/1940 | Wheeler |
| 3,628,152 A | 12/1971 | Carlson |
| 4,271,529 A | 6/1981 | Strammello, Jr. |
| 4,409,557 A | 10/1983 | Sechi |
| 4,628,540 A | 12/1986 | Hendriks |

FOREIGN PATENT DOCUMENTS

JP    10-242805    9/1998

OTHER PUBLICATIONS

European Search Report dated Apr. 9, 2008 from European Application No. 07023359.8.

*Primary Examiner*—Robert Pascal
*Assistant Examiner*—Kimberly E Glenn
(74) *Attorney, Agent, or Firm*—Beyer Law Group LLP

(57) ABSTRACT

The invention provides a variable tuning circuit capable of extending a variable range in a high frequency band, ensuring the value of L of an inductor to increase the value of Q of a circuit in a low frequency band, and preventing a reduction in gain, an increase in noise, and unstable oscillation.

A variable tuning circuit includes: a first parallel resonance circuit that includes a varactor diode, a capacitor connected in series to the varactor diode, and a first inductor connected in parallel to the varactor diode and the capacitor; and a second parallel resonance circuit that includes a second inductor connected in parallel to the varactor diode with a direct current cut-off capacitor interposed therebetween. When the varactor diode has a maximum capacitance, a resonant frequency of the second parallel resonance circuit is set about a lowest frequency in a variable frequency range.

3 Claims, 4 Drawing Sheets

VARIABLE TUNING CIRCUIT USING VARIABLE CAPACITANCE DIODE AND TELEVISION TUNER

CLAIM OF PRIORITY

This application claims benefit of the Japanese Patent Application No. 2006-328153 filed on Dec. 5, 2006, which is hereby incorporated by reference.

BACKGROUND OF THE INVENTION

1. Field of the Invention

The present invention relates to a variable tuning circuit using a variable capacitance diode and a television tuner provided with the variable tuning circuit.

2. Description of the Related Art

Television tuners are provided with variable tuning circuits using variable capacitance diodes in order to select a received frequency or remove interference waves (for example, see JP-A-10-242805). FIG. 3 is a functional block diagram illustrating the structure of a television tuner disclosed in JP-A-10-242805. In FIG. 3, television radio wave signals received by an antenna 101 are tuned by a tuning circuit 102, and the tuned signals are amplified by a high-frequency amplifying circuit 103. Then, a double tuned circuit 104 selects a received frequency, and the selected frequency is input to a frequency mixing circuit 105. The frequency mixing circuit 105 mixes the received frequency with a local oscillation signal that is output from a local oscillating circuit 106, and the mixed frequency is converted into an intermediate frequency, which is the difference between the received frequency of the double tuned circuit 104 and the local oscillation signal that is output from the local oscillating circuit 106. Then, the converted frequency is output from the frequency mixing circuit 105. The intermediate frequency is amplified by an intermediate frequency amplifying circuit 107 and then output from the television tuner.

In the television tuner, a variable tuning circuit is provided in each of the tuning circuit 102, the double tuned circuit 104, and the local oscillating circuit 106. FIG. 4 is a diagram illustrating the structure of a general variable tuning circuit. As shown in FIG. 4, a varactor diode D1 is connected in parallel to an inductor L1, and a tuning voltage Vc is applied to a cathode of the varactor diode D1. In addition, in FIG. 4, a direct current cut-off capacitor C having a large capacitance is connected to the cathode of the varactor diode D1. In this structure, a resonant frequency is changed by varying the capacitance of the varactor diode D1 according to the level of the tuning voltage Vc applied to the varactor diode D1, thereby selecting a desired frequency.

FIG. 5 is a characteristic diagram illustrating a capacitance curve indicating a variation in capacitance according to a voltage applied to the varactor diode. On the basis of the capacitance curve shown in FIG. 5, a tuning frequency is determined by the inductor L1 that is connected in parallel to the capacitor C connected in series to the varactor diode D1. It is necessary to reduce both the value of the inductor L1 and the capacitance value in order to ensure tuning characteristics in a high frequency band. In order to ensure the tuning characteristics in a low frequency band, the capacitance of the varactor diode D1 varies while fixing the value of the inductor L1 and the capacitance value, which are reduced in order to ensure the tuning characteristics in the high frequency band.

However, since various capacitances, such as the stray capacitance of a mounting substrate and the internal capacitances of various types of semiconductor devices, exist in parallel to the varactor diode D1 in the television tuner, the variable range of the high frequency band tends to be narrowed in the variable tuning circuit.

Meanwhile, in the low frequency band of the variable tuning circuit, the value of L of the inductor L1 needs to be set to a small value, which results in a reduction in the value of Q of a circuit. For example, in the tuning circuit 102, impedance is lowered, and thus loss and noise increase, resulting a low gain. In addition, in the local oscillating circuit 106, the value of Q of the circuit decreases, which results in unstable oscillation.

SUMMARY

According to an aspect of the invention, a variable tuning circuit includes: a first parallel resonance circuit that includes a variable capacitance element, a capacitor connected in series to the variable capacitance element, and a first inductor connected in parallel to the variable capacitance element and the capacitor; and a second parallel resonance circuit that includes a second inductor connected in parallel to the variable capacitance element in an AC manner.

According to the above-mentioned structure, the second inductor is connected in parallel to the variable capacitance element in an AC manner, thereby forming the second parallel resonance circuit. Therefore, it is possible to equivalently vary the value of L such that an L characteristic of the tuning circuit increases in the low frequency band and decreases in the high frequency band, by changing the capacitance of the variable capacitance element. In addition, it is possible to extend a variable range in the high frequency band and ensure the value of L of the inductor to increase the value of Q of a circuit. As a result, it is possible to prevent a reduction in gain, an increase in noise, and unstable oscillation.

In the variable tuning circuit according to the above-mentioned aspect, preferably, when the variable capacitance element has a maximum capacitance, a resonant frequency of the second parallel resonance circuit is set about a lowest frequency in a variable frequency range.

According to the above-mentioned structure, the L characteristic of the tuning circuit becomes the highest in the vicinity of the lowest frequency in the low frequency band, and the inductance of the inductor forming the tuning circuit is larger than that in a circuit according to the related art, when a frequency in the low frequency band is selected. Therefore, it is possible to increase the value of Q of a circuit in the low frequency band by reducing the capacitance of the capacitor connected in series to the variable capacitance element.

In the variable tuning circuit according to the above-mentioned aspect, preferably, when the variable capacitance element has a minimum capacitance, the resonant frequency of the second parallel resonance circuit is set so as to be higher than a highest frequency within a variable frequency range in a high frequency band.

According to the above-mentioned structure, the L characteristic of the tuning circuit is lowered in the vicinity of the highest frequency in the high frequency band, and the inductance of the inductor forming the tuning circuit is smaller than that in a circuit according to the related art, when a frequency in the low frequency band is selected. Therefore, it is possible to extend a variable range in the high frequency band by increasing the value of L of the first inductor that is connected in parallel to the variable capacitance element and by reducing the capacitance of the capacitor that is connected in series to the variable capacitance element.

According to another aspect of the invention, a television tuner includes the variable tuning circuit according to the above-mentioned aspect in at least one of an input tuning circuit, a single inter-stage tuning circuit, and an oscillating circuit.

According to a variable tuning circuit of a television tuner of an embodiment of the invention, it is possible to extend a variable range in a high frequency band, ensure the value of L of an inductor to increase the value of Q of a circuit in a low frequency band, and prevent a reduction in gain, an increase in noise, and unstable oscillation.

DESCRIPTION OF THE EMBODIMENTS

Hereinafter, exemplary embodiments of the invention will be described in detail with reference to the accompanying drawings.

A television tuner according to an embodiment of the invention is a single band television tuner for receiving UHF, and is provided with four tuning circuits including an input tuning circuit, an RF double tuned circuit, and a local oscillating circuit.

Figure 1:
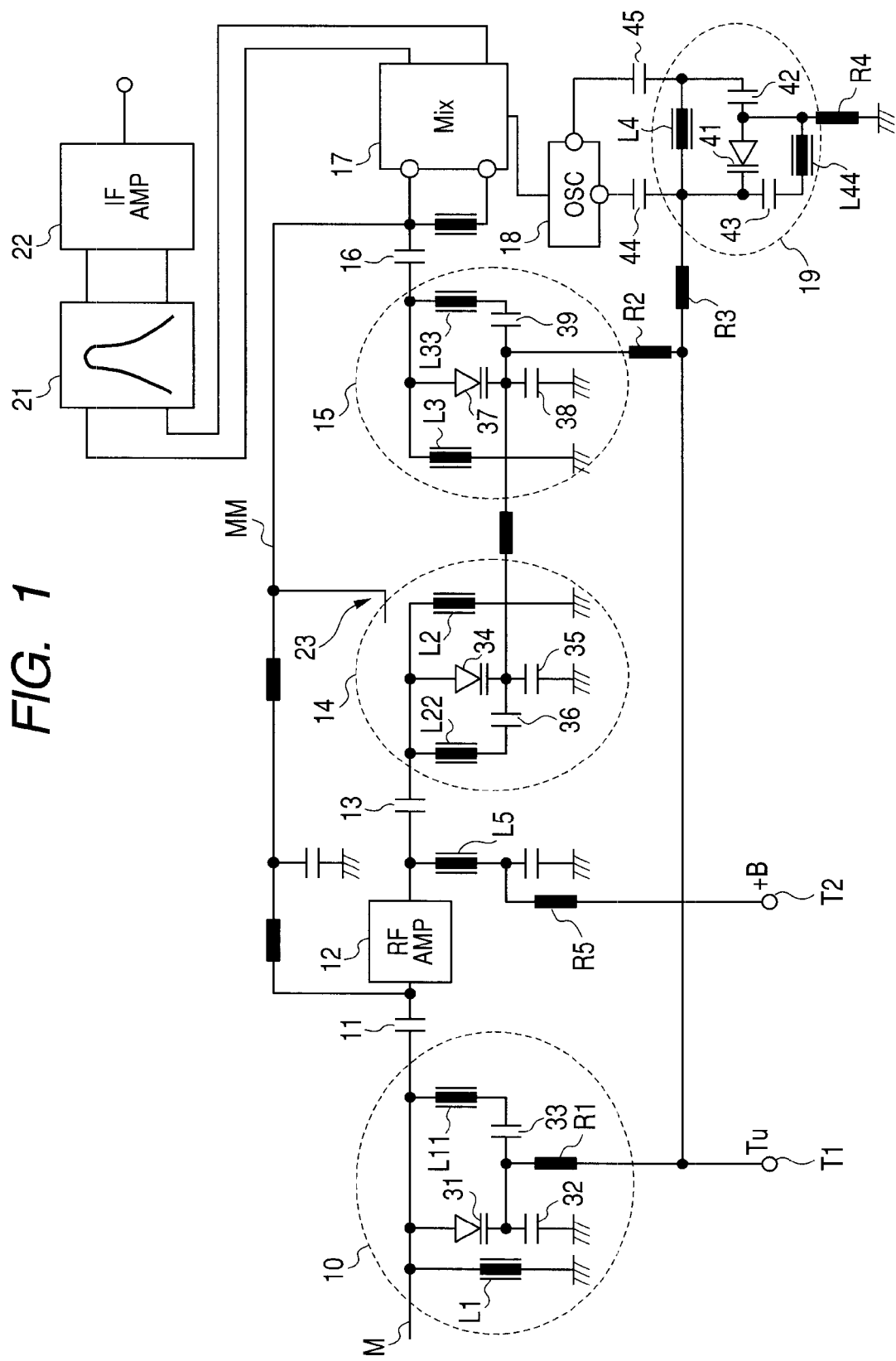
FIG. 1 is a diagram illustrating the structure of a television tuner according to an embodiment of the invention.
Figure 3:
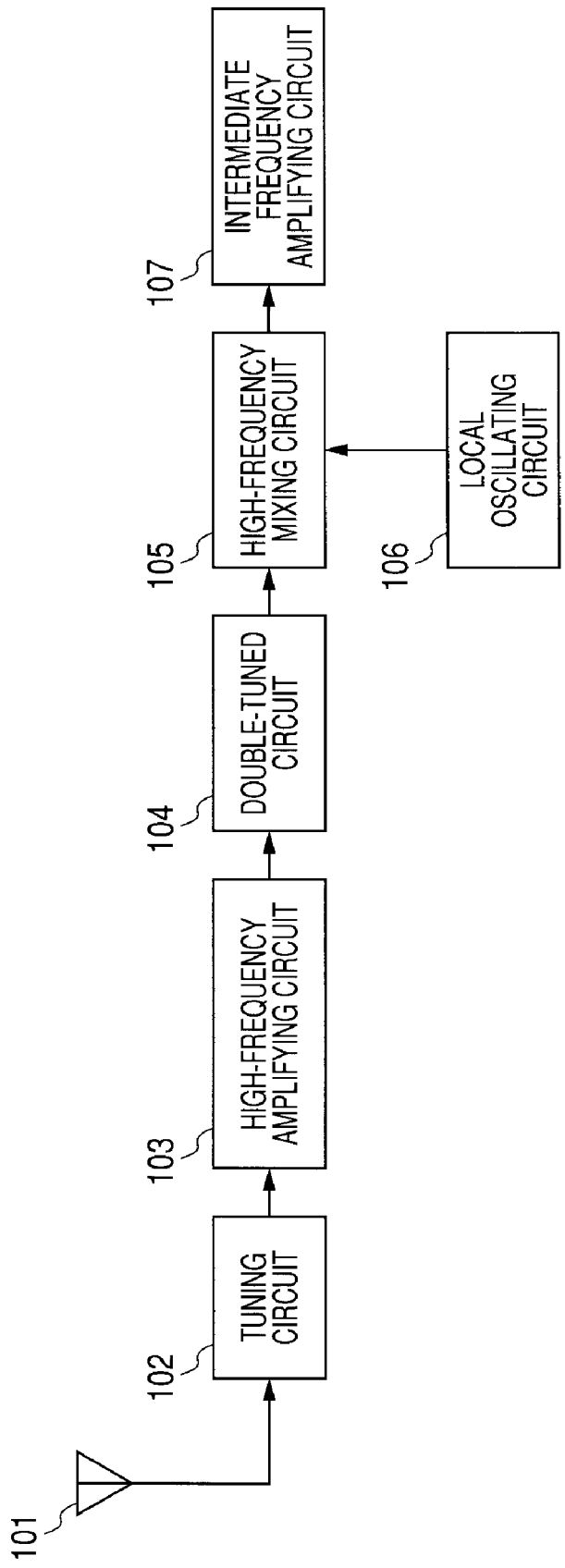
FIG. 3 is a diagram illustrating the overall structure of a television tuner according to the related art.
Figure 4:
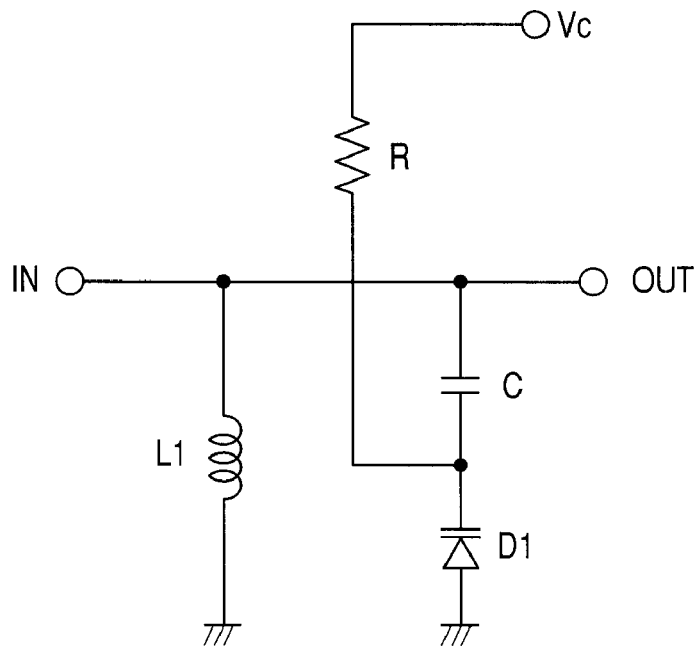
FIG. 4 is a diagram illustrating the structure of a tuning circuit according to the related art.
Figure 5:
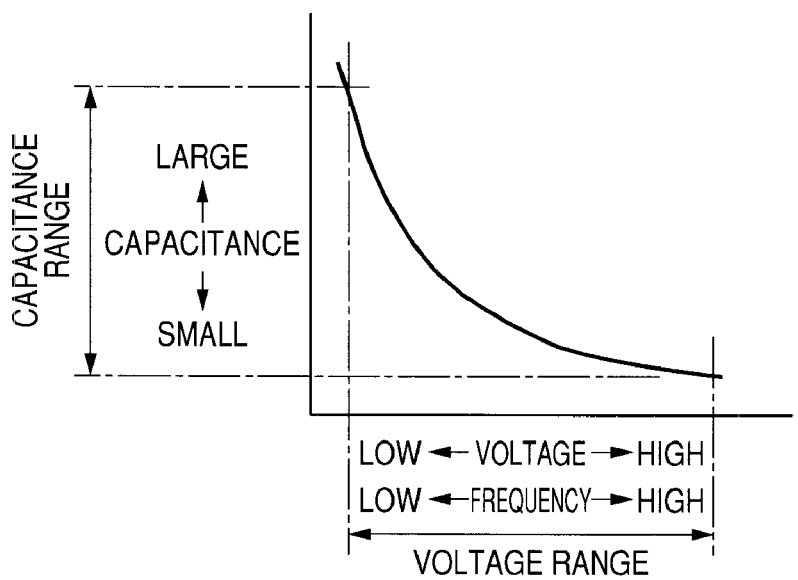
FIG. 5 is a graph illustrating a capacitance curve of a varactor diode.

FIG. 1 is a circuit diagram illustrating the television tuner according to this embodiment, and shows a circuit structure after an input tuning circuit. An input terminal of an input tuning circuit 10 is connected to an output terminal of an antenna (not shown), and an output terminal of the input tuning circuit 10 is connected to an input terminal of a high-frequency amplifying circuit 12 through a coupling capacitor 11. An output terminal of the high-frequency amplifying circuit 12 is connected to a primary tuning circuit 14 of a double tuned circuit through a coupling capacitor 13. An output terminal of a secondary tuning circuit 15 of the double tuned circuit is connected to a frequency converting circuit 17 through a coupling capacitor 16. A local oscillating circuit 18 is connected to the frequency converting circuit 17, and a resonance circuit 19 for determining an oscillation frequency is connected to the local oscillating circuit 18. In addition, an output terminal of the frequency converting circuit 17 is connected to an intermediate frequency amplifying circuit 22 through a band pass filter 21. The basic operations of the components of the television tuner are similar to those of a television tuner shown in FIG. 3 except for a tuning operation, which will be described later.

In the input tuning circuit 10, a first inductor L1 is connected between the ground and a signal transmission line M which is connected to an output terminal of an antenna and through which a high-frequency signal is transmitted. A varactor diode 31 is connected in parallel to the first inductor L1. The varactor diode 31 has an anode that is connected to the signal transmission line M and a cathode that is connected to the ground through a direct current cut-off capacitor 32. In this embodiment, a second inductor L11 is connected in parallel to the varactor diode 31 in an AC manner. The second inductor L11 has one end that is connected to the anode of the varactor diode 31 and the other end that is connected to the cathode of the varactor diode 31 through the capacitor 33. A tuning voltage Tu is applied from an integrated circuit (not shown) to a tuning terminal T1. The cathode of the varactor diode 31 is connected to the tuning terminal T1 through a resistor R1 so as to be supplied with the tuning voltage Tu that is controlled according to a received frequency.

Each of the primary tuning circuit 14, the secondary tuning circuit 15, and the resonance circuit 19 of the double tuned circuit includes a first inductor and a varactor diode, which form a resonance circuit, and a second inductor that is connected in parallel to the varactor diode in an AC manner, similar to the input tuning circuit 10.

That is, the primary tuning circuit 14 includes a parallel resonance circuit having a first inductor L2, serving as a primary coil, a varactor diode 34, and a direct current cut-off capacitor 35 connected in series to one another, and a second inductor L22 that is connected in parallel to the cathode of the varactor diode 34 with a capacitor 36 interposed therebetween. A power supply terminal T2 is supplied with a power supply voltage B from the outside. The power supply voltage B is applied from the power supply terminal T2 to an output terminal of the high-frequency amplifying circuit 12 through a resistor R5 and a choke coil L5, and the coupling capacitor 13 is provided between the output terminal of the high-frequency amplifying circuit 12 and an anode of the varactor diode 34, serving as an input terminal of the primary tuning circuit 14.

The secondary tuning circuit 15 includes a parallel resonance circuit having a first inductor L3, serving as a secondary coil, a varactor diode 37, and a direct current cut-off capacitor 38 connected in series to one another. In addition, the secondary tuning circuit 15 includes a second inductor L33 that is connected in parallel to a cathode of the varactor diode 37 with a capacitor 39 interposed therebetween. The tuning voltage Tu is applied to the cathode of the varactor diode 37 through a resistor R2.

The resonance circuit 19 of the local oscillating circuit 18 includes a parallel resonance circuit having a first inductor L4, a varactor diode 41, and a direct current cut-off capacitor 42 connected in series to one another. The resonance circuit 19 further includes a second inductor L44 that is connected in parallel to a cathode of the varactor diode 41 with a capacitor 43 interposed therebetween. The tuning voltage Tu is applied to the cathode of the varactor diode 41 through a resistor R3, and an anode of the varactor diode 41 is connected to the ground through a resistor R4. In addition, the first inductor L4 has one end that is connected to the local oscillating circuit 18 through a direct current cut-off capacitor 44 and the other end that is connected to the local oscillating circuit 18 through a direct current cut-off capacitor 45.

Further, in this embodiment, a signal line MM is connected between an input terminal of the high-frequency amplifying circuit 12 and an input terminal of the frequency converting circuit 17, and the signal line MM and one end of the first inductor L2 of the primary tuning circuit 14 are connected to each other with a capacitor 23, such as a pattern, interposed therebetween. This circuit structure can reduce imaginary components.

Next, the setting of the value of L of the second inductor and the value of C of the direct current cut-off capacitor that is connected in series to the varactor diode in each of the variable tuning circuits 10, 14, 15, and 19 will be described below. An example of the circuit structure of the resonance circuit 19 will be described below. In this embodiment, the tuning circuits 10, 14, and 15 may have the same circuit structure as the resonance circuit 19.

Figure 2:
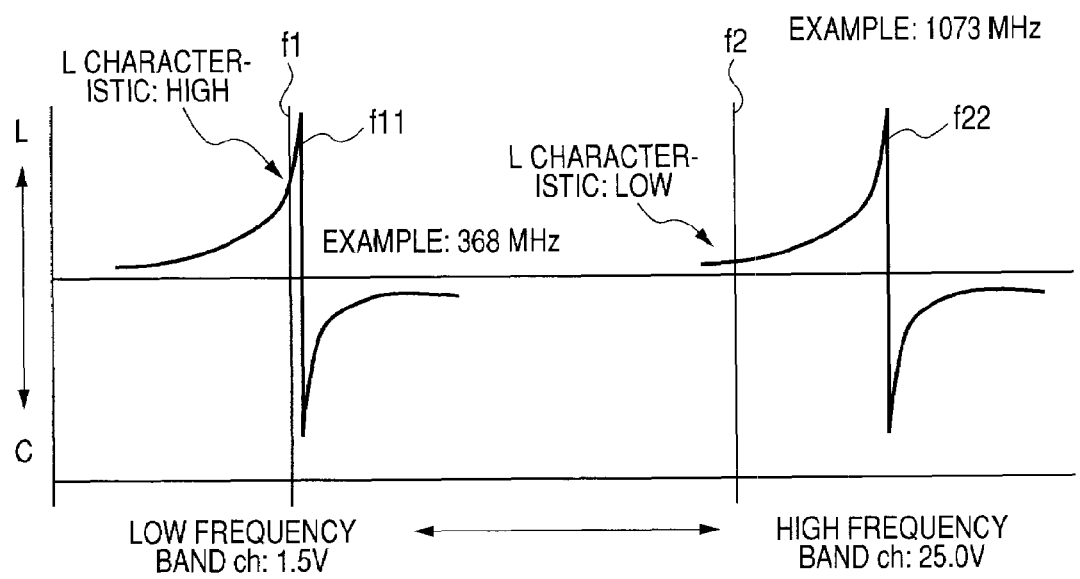
FIG. 2 is a diagram illustrating an operating principle according to the embodiment.

In this embodiment, as shown in FIG. 2, a lowest target frequency in a low frequency band of the television tuner is referred to as a frequency f1, and the value of L of the second inductor L44 is selected such that a resonant frequency f11 obtained by the second inductor L44 and the varactor diode 41 is equal to the lowest target frequency f1 in the low frequency band, when the varactor diode 41 has the maximum capacitance (a tuning voltage when the lowest target frequency f1 in the low frequency band is selectively received). For example, when the capacitance of the varactor diode 41 at the lowest frequency in the low frequency band is 17 pF (a tuning voltage Vc is 1.5 V) and the lowest frequency f1 in the low frequency band is set to 368 MHz, the value of L of the second inductor L44 is set to 11 nH. The values of the first inductor L4 and the direct current cut-off capacitor 42 are selected such that the resonant frequency f1 obtained by the first and second inductors L4 and L44, the varactor diode 41, and the direct current cut-off capacitor 42 is slightly lower than the resonant frequency f11, when the varactor diode 41 has the maximum capacitance. In this way, when the lowest frequency in the low frequency band is selectively received, an L characteristic close to the highest level is obtained during the parallel resonance caused by the second inductor L44 and the varactor diode 41.

Meanwhile, as shown in FIG. 2, a highest target frequency in a high frequency band of the television tuner according to this embodiment is referred to as a frequency f2, and a resonant frequency f22 obtained by the second inductor L44 and the varactor diode 41, which is set as described above, is considerably higher than the highest target frequency f2 in the high frequency band, when the varactor diode 41 has the minimum capacitance (a tuning voltage when the highest target frequency f2 in the high frequency band is selectively received). For example, when the highest target frequency f2 in the high frequency band is 860 MHz and the second inductor L44 is set to 11 nH, a resonance point is formed around a frequency of 1073 MHz. In this way, when the highest frequency in the low frequency band is selectively received, the L characteristic close to the lowest level is obtained during the parallel resonance caused by the second inductor L44 and the varactor diode 41.

As described above, according to this embodiment, it is possible to equivalently change the value of L such that the L characteristic of the tuning circuit increases in the low frequency band and decreases in the high frequency band, by varying the capacitance of the varactor diode 41.

Further, in the high frequency band, the L characteristic is excessively lowered during the parallel resonance caused by the second inductor L44 and the varactor diode 41. Since the inductor having a small inductance is connected in parallel to the first inductor L4, it is necessary to increase the value of L of the first inductor L4 to be larger than that according to the related art, in order to make the resonant frequency obtained by the first and second inductors L4 and L44, the varactor diode 41, and the direct current cut-off capacitor 42 equal to the highest target frequency f2.

Meanwhile, in the low frequency band, since the first and second inductors L4 and L44 are selected as described above, the values of the inductors forming the tuning circuit increase. Therefore, the capacitance of the direct current cut-off capacitor 42, which is connected in series to the varactor diode 41, is reduced to set a tuning frequency in the low frequency band. As described above, in this embodiment, the capacitance of the direct current cut-off capacitor 42 is reduced such that, when the varactor diode 41 has the maximum capacitance, the resonant frequency f1 obtained by the first and second inductors L4 and L44, the varactor diode 41, and the direct current cut-off capacitor 42 is slightly lower than the resonant frequency f11.

As described above, according to this embodiment, the value of L of the second inductor L44 is set such that, when the varactor diode 41 has the maximum capacitance, the resonant frequency f11 obtained by the second inductor L44 and the varactor diode 41 is equal to the lowest target frequency f1 in the low frequency band. Therefore, it is possible to lower the L characteristic to an excessively low level during the parallel resonance caused by the second inductor L44 and the varactor diode 41 in the low frequency band, and to easily extend a variable range in the high frequency band. In addition, in this embodiment, the value of L of the first inductor L4 increases, and the capacitance of the direct current cut-off capacitor 42 is reduced, which makes it possible to prevent a reduction in the value of Q of a circuit. As a result, it is possible to prevent a reduction in gain, an increase in noise, and unstable oscillation of the local oscillating circuits 18 and 19.

Furthermore, in the input tuning circuit 10, the primary tuning circuit 14, and the secondary tuning circuit 15, the values of L of the second inductors L11, L22, and L33 are set such that resonant frequencies obtained by the varactor diodes 31, 34, and 37 and the second inductors L11, L22, and L33 are close to the lowest target frequency f1 in the low frequency band. Therefore, it is possible to extend a variable range in the high frequency band and ensure the value of Q of a circuit. In addition, when the resonant frequency f11 obtained by the second inductor and the varactor diode is approximate to the lowest target frequency f1 in the low frequency band, the L characteristic in the low frequency band increases. The resonant frequency f11 is not necessarily set to be equal to or approximate to the lowest target frequency f1 in the low frequency band.

The invention is not limited to a single band tuner for receiving UHF, but the invention can be applied to a television tuner that switches frequency among UHF, a VHF high band, and a VHF low band. Further, one inter-stage tuning circuit may be used instead of the double tuned circuit composed of the primary and secondary inter-stage tuning circuits.

The invention can be applied to a television tuner using a variable capacitance diode.

The invention claimed is:

1. A variable tuning circuit comprising:
   a first parallel resonance circuit that includes a variable capacitance element, a capacitor connected in series to the variable capacitance element, and a first inductor connected in parallel to the variable capacitance element and the capacitor; and
   a second parallel resonance circuit that includes a second inductor connected in parallel to the variable capacitance element in an AC manner,
   wherein, when the variable capacitance element has a maximum capacitance, a resonant frequency of the second parallel resonance circuit is set about a lowest frequency in a variable frequency range.

2. The variable tuning circuit according to claim 1,
   wherein, when the variable capacitance element has a minimum capacitance, the resonant frequency of the second parallel resonance circuit is set so as to be higher than a highest frequency within a variable frequency range in a high frequency band.

3. A television tuner comprising the variable tuning circuit according to claim 1 in at least one of an input tuning circuit, a single inter-stage tuning circuit, and an oscillating circuit.

* * * * *